(12) United States Patent
Yoo

(10) Patent No.: US 8,054,253 B2
(45) Date of Patent: Nov. 8, 2011

(54) ORGANIC LIGHT EMITTING DIODES DISPLAY AND AGING METHOD THEREOF

(75) Inventor: Jaeho Yoo, Youngin-si (KR)

(73) Assignee: Samsung Mobile Display Co., Ltd. (KR)

(*) Notice: Subject to any disclaimer, the term of this patent is extended or adjusted under 35 U.S.C. 154(b) by 1238 days.

(21) Appl. No.: 11/787,630

(22) Filed: Apr. 17, 2007

(65) Prior Publication Data

US 2008/0169460 A1     Jul. 17, 2008

(30) Foreign Application Priority Data

Jan. 15, 2007  (KR) .................. 10-2007-0004436

(51) Int. Cl.
*G09G 3/30* (2006.01)

(52) U.S. Cl. ............... 345/77; 345/76; 345/85; 345/95; 438/4; 438/99; 257/E51.018

(58) Field of Classification Search ........... 438/4, 99; 257/40, 798, E51.018; 345/76, 77, 82, 83, 345/84, 95; 315/169.3

See application file for complete search history.

(56) References Cited

U.S. PATENT DOCUMENTS

| 2003/0227262 | A1* | 12/2003 | Kwon | 315/169.3 |
| 2004/0051469 | A1* | 3/2004 | Ha et al. | 315/169.3 |
| 2005/0219169 | A1* | 10/2005 | Chung et al. | 345/76 |

FOREIGN PATENT DOCUMENTS

| JP | 2006/210213 | 8/2006 |
| KR | 10-2004-0019208 A | 5/2004 |
| KR | 1020040081840 | 9/2004 |
| KR | 1020060052303 A | 5/2006 |

* cited by examiner

*Primary Examiner* — Julio J Maldonado
(74) *Attorney, Agent, or Firm* — Knobbe Martens Olson & Bear, LLP

(57) ABSTRACT

An organic light emitting diode display and an aging method thereof are presented. The method provides the organic light emitting diode display with improved reliability as a progressive dark defect is removed, and the lifetime and the white balance of the organic light emitting diode display is secured by executing an aging treatment of high luminance using a pixel circuit including an aging circuit for supplying the organic light emitting diode with an aging pulse.

17 Claims, 5 Drawing Sheets

ORGANIC LIGHT EMITTING DIODES DISPLAY AND AGING METHOD THEREOF

CROSS-REFERENCE TO RELATED APPLICATION

This application claims priority to and the benefit of Korean Patent Application No. 10-2007-0004436, filed Jan. 15, 2007, the entire content of which is incorporated herein by reference.

BACKGROUND

1. Field

The field relates to an organic light emitting diode display and an aging method thereof, and more particularly, to treating pixels with a high luminance by way of a pixel circuit which includes an aging line and an aging control switching transistor.

2. Description of Related Technology

An organic light emitting diode display is one kind of a flat panel display using an organic light emitting diode (OLED) in which light is generated by the recombination of the electron supplied by a cathode and the hole supplied by an anode. The organic light emitting diode display has advantages in that it is thin, wide viewing angle, and high speed responsive.

A conventional organic light emitting diode display includes a pixel circuit formed at the area near which a scan line, an emission control line and a data line cross one another. The pixel circuit includes a driving transistor which is driven according to the data signal supplied by the data line, a storage capacitor for storing the voltage between a source electrode of the driving transistor and a gate electrode, and an organic light emitting diode which emits light according to a driving current controlled by a plurality of switching transistors and driving transistors.

In some embodiments, the organic light emitting diode display is fabricated through a process wherein a thin film transistor (TFT) is formed and an organic light emitting diode is formed on the thin film transistor. Among the processes used, during the process wherein an organic light emitting diode layer is formed, a dark defect can be generated by a short circuit between an anode and a cathode caused by the foreign body generated during the step in which an organic layer is deposited. In addition, where the organic light emitting diode is lit immediately after the organic layer is deposited, luminance can decrease relatively suddenly due to an initial degradation effect. Furthermore, for a full color organic light emitting diode display, the white balance generated by mixing of a red pixel, a green pixel and a blue pixel can degrade in a short time.

Conventionally, in order to solve the aforementioned problems and increase reliability of the organic light emitting diode display, a variety of technologies have been developed. For passive matrix organic light emitting diode display (PMOLED), an aging method is used. Because foreign substances causing a defect can be removed, the possibility of the defect being generated is reduced before the light emitting diode display comes onto the market, thereby increasing reliability thereof.

For active matrix organic light emitting diode display (AMOLED), however, it is not easy to use the aging method because organic light emitting diode is formed on the thin film transistor.

SUMMARY OF CERTAIN INVENTIVE ASPECTS

Certain aspects solve the problems described above, and provide an organic light emitting diode display and an aging method thereof wherein the reliability can be improved as a progressive dark defect is removed and the lifetime and the white balance of the organic light emitting diode display is secured because an aging treatment of high luminance becomes possible by a pixel circuit which includes an aging line and an aging control switching transistor.

One aspect is an organic light emitting diode display, including an organic light emitting diode configured to emit light, a driving transistor coupled to the organic light emitting diode, and a first storage capacitor including a first electrode coupled to a control electrode of the organic light emitting diode and a second electrode coupled to a first power source. The display also includes a first switching transistor including a first electrode coupled to a data line, a control electrode coupled to a scan line, and a second electrode coupled to a first electrode of the driving transistor, and an aging circuit configured to supply the organic light emitting diode with an aging pulse, where the aging circuit includes an aging line coupled to an anode of the organic light emitting diode and an aging control switching transistor coupled between the organic light emitting diode and the aging line.

Another aspect is an aging method of an organic light emitting diode display, the display including an aging line coupled to an organic light emitting diode, the method including supplying an aging pulse to the organic light emitting diode through the aging line so as to accelerate a decrease of luminance of the organic light emitting diode.

DETAILED DESCRIPTION OF CERTAIN INVENTIVE EMBODIMENTS

Certain embodiments will now be described more fully hereinafter with reference to the accompanying drawings, in which certain embodiments are shown. This invention may, however, be embodied in many different forms and should not be construed as limited to the embodiments set forth herein;

rather, these embodiments are provided so that this disclosure will be thorough and complete.

In the following, when one part is recited as being connected with or to another part, it means that not only may the one part be connected directly with the other part, but that the one part may also be coupled to the other part with a third device intervened between.

The schematic structure of an organic light emitting diode display to which one embodiment is applied will be described.

Figure 1:
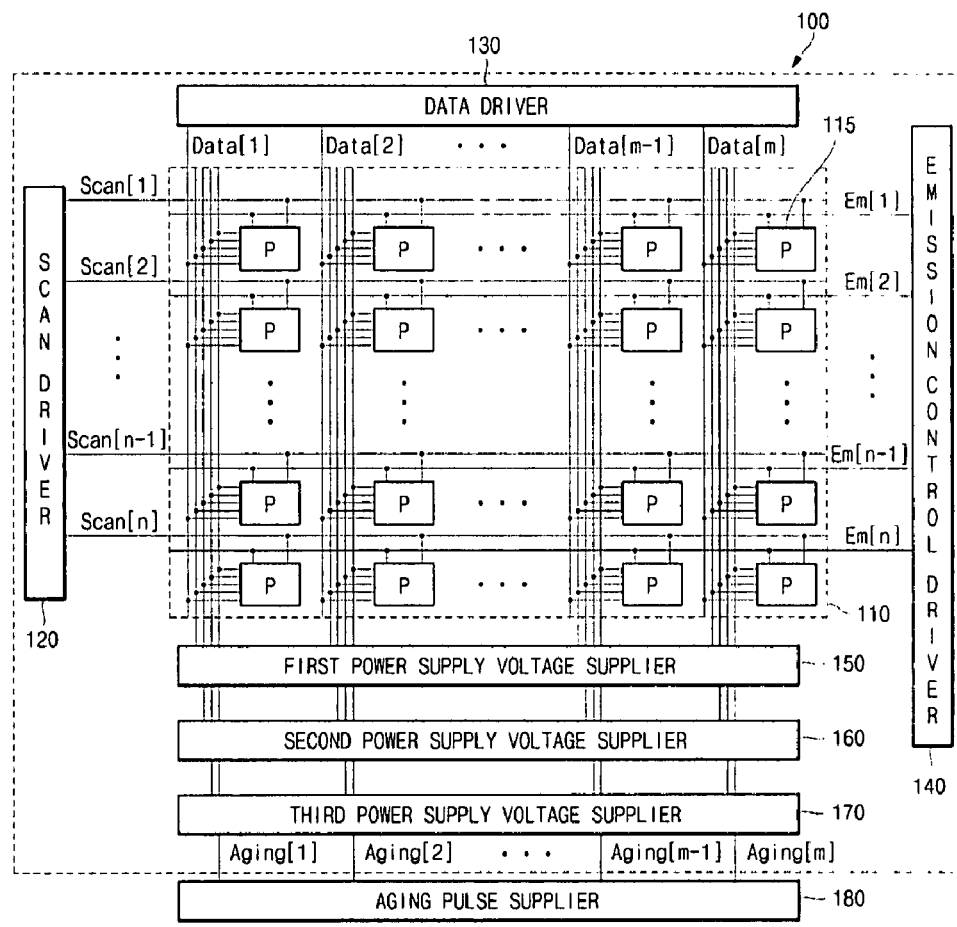
FIG. 1 is a drawing depicting the schematic structure of an organic light emitting diode display to which one embodiment is applied.

FIG. 1 is a drawing depicting the schematic structure of an organic light emitting diode display.

Referring to FIG. 1, an organic light emitting diode display 100 can include an organic light emitting diode display panel 110, a scan driver 120, a data driver 130, an emission control driver 140, a first to third voltage source supplier 150, 160 and 170. According to some embodiments, the organic light emitting diode display 100 is coupled to an aging pulse supplier 50 during an aging period for accelerating initial decrease of luminance of an organic light emitting diode which will be described hereinafter.

The organic light emitting diode display panel 110 includes a plurality of scan lines (scan[1] to scan[n]) which are arranged in column direction, a plurality of emission control lines (em[1] to em[n]) which are arranged in column direction, a plurality of data lines (data[1] to data[n]) which are arranged in row direction, a plurality of aging lines (Aging[1] to Aging[m]) which are arranged in row direction, and a plurality of pixels (P, Pixel) which are arranged in row direction.

The pixel (P, Pixel) is formed at the area at which the scan lines (scan[1] to scan[n]), the emission control lines (em[1] to em[n]) and the data lines (data[1] to data[n]) intersect one another. The pixel (P, Pixel) emits light corresponding to a data signal when it is supplied with the data signal from the data lines (data[1] to data[m]) selectively according to the scan signal supplied from the scan lines (scan[1] to scan[n]). Furthermore, the pixel (P, Pixel) controls the emission time responding to the emission control signal supplied from the emission control lines (em[1] to em[n]). A driving circuit (or a pixel circuit) 115 and aging lines (Aging[1] to Aging[m]) of the pixel (P, Pixel) will be described more particularly following.

The scan driver 120 generates a scan signal and supplies a plurality of scan lines (scan[1] to scan[n]) with the scan signal in sequence. The organic light emitting diode display panel 100 selects a pixel (P, Pixel) according to the scan signal supplied from the scan driver 120.

The data driver 130 generates a data signal and supplies a plurality of data lines (data[1] to data[m]) with the data signal in sequence.

The emission control driver 140 generates an emission control signal and supplies a plurality of emission control lines (em[1] to em[n]) with the emission control signal in sequence.

The first voltage source supplier 150 supplies the pixel (P, Pixel) with a voltage source. The second voltage source supplier 160 supplies the pixel (P, Pixel) with a reference voltage. The third voltage source supplier 170 supplies the pixel (P, Pixel) with an initializing voltage.

Meanwhile, in the organic light emitting diode display 100, a dark defect can be caused by a short circuit generated between an anode and a cathode of an organic light emitting diode by a foreign body during the course of a step during which the pixel (P, Pixel) is fabricated. Furthermore, in case that the organic light emitting diode is lighted immediately, luminance can be decreased relatively suddenly by initial degradation effect. To solve the problems which can be caused in the organic light emitting diode display 100, included is a period during which the organic light emitting diode undergoes an aging treatment using a pixel circuit 115 of the organic light emitting diode display in order to accelerate initial decrease of luminance of the organic light emitting diode display before the pixel (P, Pixel) is driven (before it is brought to market). Hereinafter, the period during which the organic light emitting diode undergoes an aging treatment will be called as an aging period.

During the aging period, the pixel (P, Pixel) is supplied with an aging pulse of high luminance (high current) through the aging lines (Aging[1] to Aging[m]). The aging lines (Aging[1] to Aging[m]) can be arranged in parallel direction with the data lines (data[1] to data[m]). However, the direction in which the aging lines (Aging[1] to Aging[m]) are arranged is not limited to this embodiment, and they can be arranged in parallel direction with the scan lines (scan[1] to scan[n]), for example.

The aging pulse supplier 50 is coupled to the pixel circuit 115 through the aging lines (Aging[1] to Aging[m]) during the aging period. The aging pulse supplier 50 supplies the pixel circuit 1150 with an aging pulse of an alternating current. The aging pulse supplier 50 can also include a probe (not shown) and a switch (not shown) for supplying the pixel circuit 115 with an aging pulse. The aging pulse can be determined to have a voltage level from 25V, the maximum, to −25V, the minimum. If the magnitude of the aging pulse is excessive, the organic light emitting diode can be damaged. However, the voltage level of the aging pulse can be changed according to the thickness of an organic light emitting device, consequently, the voltage is not limited to this embodiment.

A pixel circuit of an organic light emitting diode display according to an embodiment will be described more particularly in the following.

Figure 2:
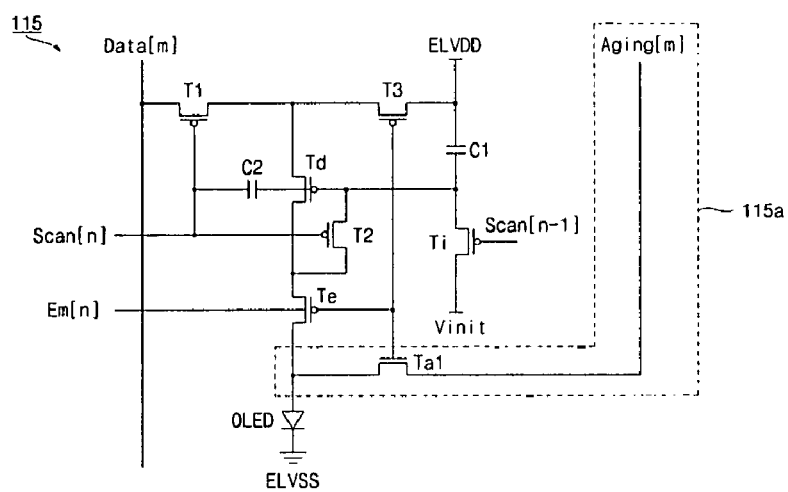
FIG. 2 is a drawing depicting a pixel circuit of an organic light emitting diode display according to one embodiment.

FIG. 2 is a drawing depicting a pixel circuit of an organic light emitting diode display according to one embodiment. In the following, embodiments will be described focusing on one particular pixel circuit 115, however, other pixel circuits can be used.

Referring to FIG. 2, a pixel circuit of an organic light emitting diode display according to one embodiment can include an organic light emitting diode (OLED) for displaying an image by a driving current, a driving transistor (Td) for supplying a driving current as it is coupled to the organic light emitting diode (OLED), first to second storage capacitors (C1 and C2); first to third switching transistors (T1 to T3), an emission control switching transistor (Te), an initializing switching transistor (T1), an aging circuit 115a for supplying the organic light emitting diode (OLED) with an aging pulse, and a plurality of power sources (ELVDD, ELVSS and Vinit). According to certain embodiments, an aging control switching transistor (Ta1) for controlling the aging line (Aging[m]) coupled to the organic light emitting diode (OLED) and an aging current (a current flowed by an aging pulse) flowing through the aging line (Aging[m]) can be formed at the aging circuit 115a.

The organic light emitting diode (OLED) includes an anode coupled to the driving transistor (Td) and a cathode coupled to the second power source (ELVSS). The organic light emitting diode (OLED) emits any one of the red, green or blue lights responding to the driving current supplied through the driving transistor. The organic light emitting diode (OLED) is made of an organic material which is fluorescent or phosphorescent.

The driving transistor (Td) includes a first electrode (source or drain) connected with the first power source (ELVDD), a second electrode (drain or source) connected the anode of the organic light emitting diode (OLED) and a control electrode (or a gate electrode) which operates according to the data signal supplied from the data line (data[m]). The driving transistor (Td) delivers a driving current corresponding to the data signal supplied from the data line (data [m]) to the organic light emitting diode (OLED).

A first electrode of the first storage capacitor (C1) is connected with the control electrode of the driving transistor, and a second electrode of the first storage capacitor (C1) is coupled with the first electrode (source or drain) of the first power source (ELVDD) and the driving transistor (Td). The first storage capacitor (C1) stores the voltage between the first electrode (source or drain) and the control electrode (or a gate electrode) of the driving transistor (Td), consequently, the voltage necessary for emission of the organic light emitting diode (OLED) is maintained.

The first switching transistor (T1) includes a first electrode (source or drain) connected with the data line (data[m]), a second electrode (drain or source) connected with the driving transistor (Td) and a control electrode (or a gate electrode) connected to a scan line (Sn). The first switching transistor (T1) supplies the first storage capacitor with the data signal supplied from the data line (data[m]).

The second switching transistor (T2) includes a control electrode (or a gate electrode) coupled with the scan line (scan[n]), a first electrode (source or drain) and a second electrode (drain or source) which are coupled between the control electrode (or gate electrode) and the second electrode (drain or source) of the driving transistor (Td). The second switching transistor (T2) diode-like connects the driving transistor (Td) and stores the threshold voltage of the driving transistor (Td) in the first storage capacitor (C1).

The third switching transistor (T3) includes a first electrode (source or drain) connected to the first power source (ELVDD), a second electrode (drain or source) connected to the first electrode (source or drain) of the driving transistor (Td) and a control electrode (or a gate electrode) connected to the emission control line (em[n]). The third switching transistor (T3) delivers the first power source (ELVDD) to the first electrode (source or drain) of the driving transistor (Td) according to the emission control signal supplied from the emission control line (em[n]).

The emission control switching transistor (Te) includes a first electrode (source or drain) connected with the second electrode (drain or source) of the driving transistor (Td), a second electrode (drain or source) connected with the anode of the organic light emitting diode (OLED), and a control electrode (or a gate electrode) connected to the emission control line (em[n]). The emission control switching transistor (Te) determines the emission time by controlling a driving current which flows from the driving transistor (Td) to the organic light emitting diode (OLED) according to the emission control signal supplied from the emission control line (em[n]).

The initializing switching transistor (T1) includes a control electrode (or a gate electrode) connected to a previous scan line (scan[n−1]), a first electrode (source or drain) connected with the first electrode (source of drain) of the first storage capacitor (C1) and a second electrode (drain or source) connected to the third power source (Vinit). The initializing switching transistor (T1) initializes the voltage stored in the first storage capacitor (C1) according to a previous scan signal.

The second storage capacitor (C2) includes a first electrode coupled between the scan line (scan[n]) and the control electrode (or gate electrode) of the first switching transistor (T1) and a second electrode coupled to the control electrode (or gate electrode) of the driving transistor (Td). The second storage capacitor (C2) compensates the voltage of the control electrode (or gate electrode) of the driving transistor (Td) according to the change of the voltage level of the scan line (scan[n]).

The first power source (ELVDD) and the second power source ELVSS supply a power voltage and a reference voltage for driving the pixel circuit 115. The third power source Vinit supplies an initializing voltage for initializing the pixel circuit 115. Here, the voltage supplied by the second power source ELVSS is determined to have a lower voltage level than the voltage level supplied by the first power source (ELVDD). The second power source ELVSS may have one voltage level selected from a ground voltage or a negative voltage. Furthermore, the third power source Vinit is determined to have a lower voltage level than the lowest voltage level of the data signals supplied to the first storage capacitor (C1).

The aging circuit 115a can include an aging line (Aging [m]) coupled to the organic light emitting diode (OLED) and an aging control switching transistor (Ta1) for controlling an aging current which flows through the organic light emitting diode (OLED) as the aging control switching transistor (Ta1) is coupled to the aging line (Aging[m]).

The aging line (Aging[m]) is coupled to the organic light emitting diode (OLED) and is also coupled to an aging pulse supplier (50 of FIG. 1) connected to the outside of the organic light emitting diode display 100. The aging line (Aging[m]) supplies the organic light emitting diode (OLED) with the aging pulse generated from the aging pulse supplier (50 of FIG. 1) while the aging process is in progress.

The aging control switching transistor (Ta1) includes a control electrode coupled to the emission control line (em [n]), a first electrode (drain or source) coupled with the aging line (Aging[m]) and a second electrode (source or drain) coupled to the anode of the organic light emitting diode (OLED). The aging control switching transistor (Ta1) can be formed to have the opposite channel to the channel of the emission control switching transistor (Te). For example, in case that the emission control switching transistor (Te) is a P type field effect transistor (FET), the aging control switching transistor (Ta1) can be an N type field effect transistor. On the contrary, in case that the emission control switching transistor (Te) is an N type field effect transistor, the aging control switching transistor (Ta1) can be a P type field effect transistor. However, the kind of the aging control switching transistor (Ta1) is not limited to this embodiment. The aging control switching transistor (Ta1) is turned on or off according the signal supplied form the emission control line (em[n]) while the aging process is in progress. Consequently, the aging pulse supplied to the organic light emitting diode (OLED) is controlled by the aging control switching transistor (Ta1).

The aging line (Aging[m]) can be formed to be fixed to the first power source (ELVDD) in order to prevent voltage hunting or voltage fluctuation by a driving current from happening during the operation of the pixel circuit 115. However, other configurations may be used.

An aging method of the pixel circuit 115 of the organic light emitting diode display will be described in greater detail in the following.

Figure 3:
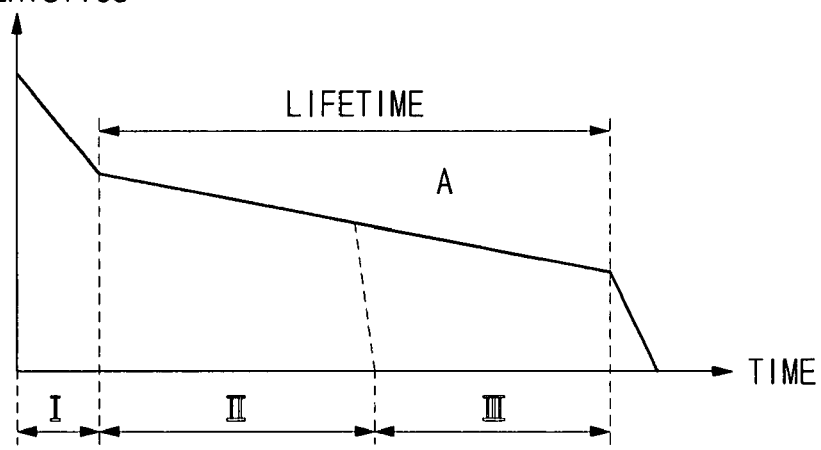
FIG. 3 is a drawing depicting the characteristics of an organic light emitting diode.
Figure 4:
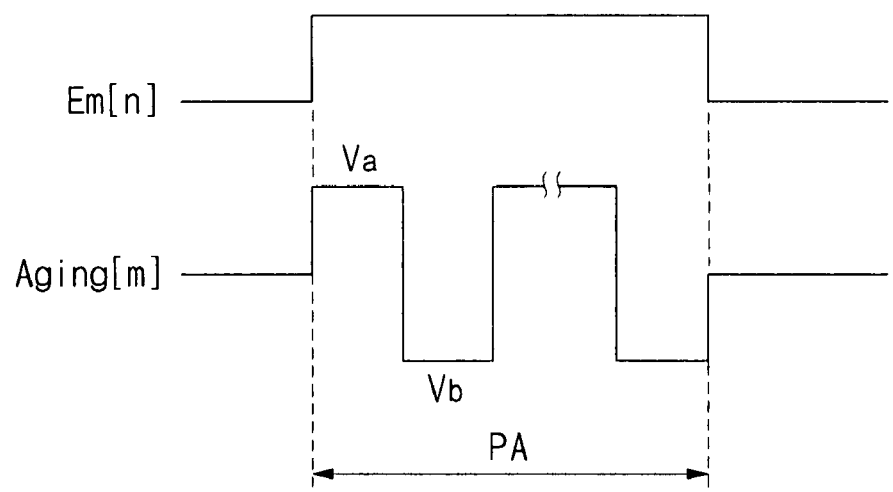
FIG. 4 is a drawing depicting a driving waveform according to an aging method of an organic light emitting diode display according one embodiment.
Figure 5:
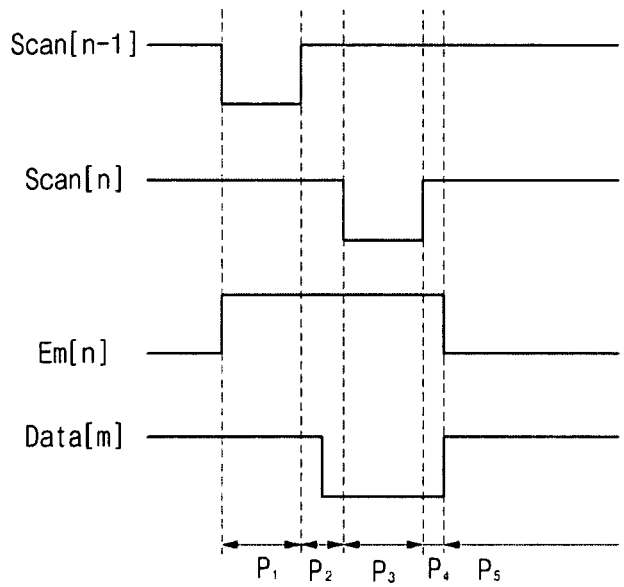
FIG. 5 is a drawing depicting a driving waveform which represents the operation of a pixel circuit after an organic light emitting diode display is brought to market.

FIG. 3 is a drawing depicting the characteristics of an organic light emitting diode (OLED). FIG. 4 is a drawing depicting a driving waveform according to an aging method of an organic light emitting diode display. FIG. 5 is a drawing depicting a driving waveform which represents the operation of a pixel circuit when an organic light emitting diode display is in a non-aging mode.

Referring to FIG. 3 to FIG. 5, an aging method using the pixel circuit 115 of the organic light emitting diode display according to one embodiment includes a first section (I) for supplying the organic light emitting diode (OLED) with an aging pulse of high luminance (high current) using the aging circuit 115a when the organic light emitting diode display is in an aging mode, a second and a third section (II and III) for use during a non-aging mode.

Referring to FIG. 3, in the case of the organic light emitting diode (OLED), the characteristics (luminance, color temperature and so on) can deteriorate by internal or external environment during fabricating process, or over time. The lifetime of the organic light emitting diode (OLED) is maintained through the first section (I) during which luminance decrease suddenly by initial degradation effect, the second section (II) during which the characteristics of the organic light emitting diode (OLED) deteriorate by the progressive defects which are not detected during shipment inspection after it is brought to market and the third section (III) during which the characteristics of the organic light emitting diode (OLED) deteriorate as the organic light emitting diode (OLED) is driven. The third section (III) can correspond to the section during which the lifetime of the organic light emitting diode (OLED) is maintained, because the organic light emitting diode (OLED) is actually driven. However, the second section (II) is not distinguished separately because the second section (II) can be changed according to the degree of the progressive defects of the organic light emitting diode display. In addition, the second section (II), together with the third section (III), will be described as a section during which the lifetime of the product is maintained after it is sold. In the present invention, an aging treatment of the organic light emitting diode (OLED) can be executed through the first section (I), that is to say, before the product is sold.

Referring to FIG. 4, during the first section (I), that is, the aging period (AP), a high level voltage (a higher voltage than the threshold voltage of the aging control switching transistor (Ta1)) is supplied through the emission control line (em[n]), and an aging pulse of an alternating current is supplied through the aging line (Aging[m]). Consequently, the aging control switching transistor (Ta1) is turned on, then a forward pulse voltage (the direction from the anode to the cathode of the organic light emitting diode (OLED)) and a backward pulse voltage (the direction from the cathode to the anode of the organic light emitting diode (OLED)) are supplied to the organic light emitting diode (OLED). The aging pulse can be supplied through the aging pulse supplier (50 of FIG. 1). The voltage level of the aging pulse is determined to have a voltage level about the maximum voltage (Va) of 25V to the minimum voltage (Vb) of −25V. If the applied voltage exceeds a threshold based on the characteristics of the device, the device can be damaged. However, the voltage level of an aging pulse is not limited to this embodiment, and it can be changed, for example, according to the thickness of the organic light emitting diode (OLED). An aging pulse can be supplied, throughout the first section (I) during which luminance is decreased by initial degradation effect of the organic light emitting diode (OLED), right before the second section (II) during which luminance is stabilized. The aging pulse can be supplied continuously within the range of, for example, about 1 minute to about 60 minutes. In case that the period during which the aging pulse is supplied is too short (shorter than 1 minute for some embodiments), the aging effect of the organic light emitting diode (OLED) can be insufficient. On the contrary, in case that the period during which the aging pulse is supplied is too long (longer than 60 minutes for some embodiments), the organic light emitting diode (OLED) can be damaged. However, the time during which the aging pulse is supplied is not limited to this embodiment, and can be changed according to various factors, such as the temperature during the aging process and the specification of the organic light emitting diode (OLED).

In the case of the organic light emitting diode (OLED), it becomes possible to supply an aging pulse which has a higher voltage level by using the aging line (Aging[m]) formed at the pixel circuit 115 of the organic light emitting diode display. In case that a forward high current flows suddenly through the organic light emitting diode (OLED), initial decrease of luminance is accelerated as the organic light emitting diode (OLED) emits light of high luminance. Accordingly, the lifetime of the organic light emitting diode (OLED) can be prolonged and the organic light emitting diode (OLED) can be operated stably. Consequently, the white balance can be maintained for a long time. In addition, a backward high current which flows suddenly through the organic light emitting diode (OLED) can remove dark defects which can be formed at the organic light emitting diode (OLED), therefore, the reliability of the product can be improved. Accordingly, the lifetime of the organic light emitting diode (OLED) can be prolonged.

Through the aging method using the pixel circuit 115 of the organic light emitting diode display according to the present invention, the first section (I) of FIG. 3 can be shortened, and the third section (III) can be prolonged as much as the first section (I) is shortened. Therefore, the lifetime of the organic light emitting diode (OLED) can be prolonged.

Referring FIG. 5, the pixel circuit 115 of the organic light emitting diode display fabricated through the aging of high luminance is driven through the initializing period (P1), the first delay period (P2), the programming period (P3), the second delay period (P4) and the emission period (P5). The aging circuit 115 does not take part in driving of the organic light emitting diode display after it is sold.

During the initializing period (P1), the initializing switching transistor (T1) is turned on as a scan signal of low level is applied from a previous scan line (scan[n−1]) to the initializing switching transistor (T1). Consequently, as an initializing voltage of the third power source (Vinit) is delivered to the control electrode (or gate electrode) of the driving transistor (Td) through the initializing switching transistor (T1), the voltage stored in the first storage capacitor (C1) and the voltage stored in the second storage capacitor (C2) are initialized.

During the first delay period (P2), on the condition that a scan signal of the scan line (scan[n]) is maintained at high level, a scan signal of a previous scan line (scan[n−1]) is changed from low level to high level. During the first delay period (P2), the data line (data[n]) is supplied with a data signal corresponding to the pixel circuit 115 connected to a current scan line (scan[n]). The first delay period (P2) is a period for preventing a previous data signal which is supplied and stored in the data line (data[n]) from being supplied to the driving transistor (Td) through the first switching transistor (T1) as the scan line (scan[n]) is supplied with a scan signal of low level.

During the programming period (P3), the first switching transistor (T1) and the second switching transistor (T2) are turned on as a scan signal of low level is applied to the scan line (scan[n]). Once the second switching transistor (T2) is turned on, the driving transistor can be diode-like connected. Consequently, the voltage corresponding to the voltage difference between the threshold voltage of the data signal and the threshold voltage of the driving transistor (Td) is supplied to the first electrode of the first storage capacitor (C1).

During the second delay period (P4), a scan signal of the scan line (scan[n]) is changed into a signal of high level before the emission control signal of the emission control line (em [n]) becomes low level. Because of the second delay period (P4), problems which can happen by the delay of the devices during the operation of the pixel circuit 115 can be prevented. Here, as a scan signal is changed from low level to high level, a compensation voltage according to the voltage difference between the first electrode and the second electrode of the second storage capacitor and the first electrode and the second electrode of the first storage capacitor can be obtained. The compensation voltage can be delivered to the control electrode (or gate electrode) of the driving transistor (Td).

During the emission period (P5), an emission control signal of low level is supplied to the control electrode (or gate electrode) of the third switching transistor (T3) and the emission control switching transistor (Te) through the emission control line (em[n]). Consequently, the first power source (ELVDD) is supplied to the first electrode (source or drain) of the switching transistor (Td), and a driving current flows through the organic light emitting diode (OLED). The organic light emitting diode (OLED) emits light during the course of the emission period (P5) as it is supplied with a driving current corresponding to the voltage difference between the first electrode (source or drain) and the control electrode (or gate electrode) of the driving transistor (Td).

A pixel circuit of an organic light emitting diode display according to another embodiment will be described in the following.

Figure 6:
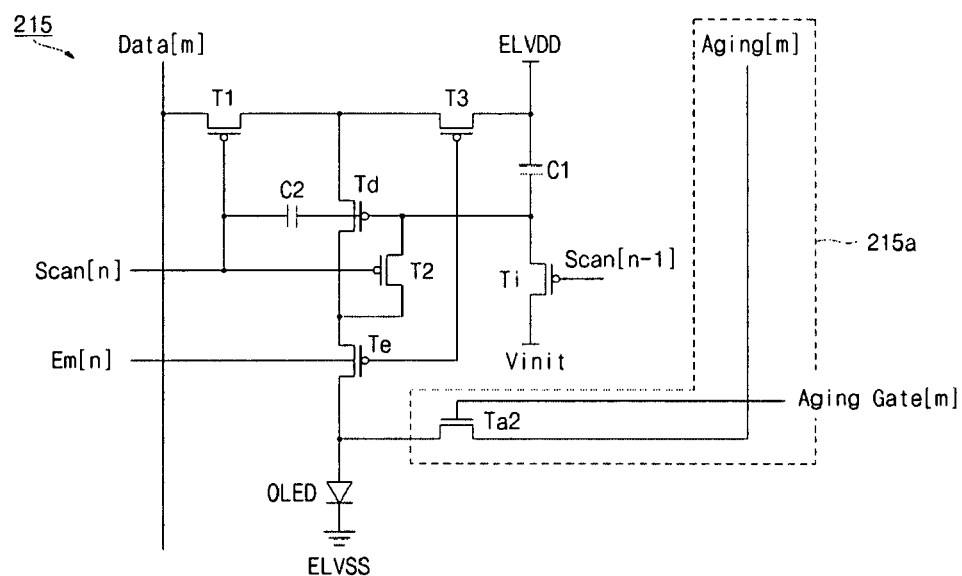
FIG. 6 is a drawing depicting a pixel circuit of an organic light emitting diode display according to another embodiment.

FIG. 6 is a drawing depicting a pixel circuit of an organic light emitting diode display according to another embodiment.

Referring to FIG. 6, a pixel circuit 215 of an organic light emitting diode display according to another embodiment includes an organic light emitting diode (OLED) for displaying an image by a driving current; a driving transistor for supplying a driving current as it is coupled to the organic light emitting diode (OLED); first to second storage capacitors (C1 and C2); first to third switching transistor (T1 to T3); an emission control switching transistor (Te); an initializing switching transistor (T1); an aging circuit 215a for supplying the organic light emitting diode (OLED) with an aging pulse; and a plurality of power sources (ELVDD, ELVSS and Vinit). According to another embodiment, the aging circuit 215a may include an aging line (Aging[m]) coupled with an organic light emitting diode (OLED); an aging control switching transistor (Ta)2 for controlling an aging current flowing through the aging line (Aging[m]); and an aging gate line Aging Gate[m] for controlling the aging control switching transistor (Ta2). The pixel circuit 215 according to another embodiment has a similar structure as that of the pixel circuit 115 of FIG. 2 except for the aging circuit 215a. Therefore, the description will be directed primarily on the parts different from the that embodiment.

The aging circuit 215a can include an aging line (Aging [m]) coupled to an organic light emitting diode (OLED); an aging control switching transistor (Ta2) for controlling an aging current flowing through the organic light emitting diode (OLED) as it is coupled to the aging line (Aging[m]); and an aging gate line (Aging Gate[m]) coupled to the control electrode (or gate electrode) of the aging control switching transistor (Ta2).

The aging line (Aging[m]) supplies the organic light emitting diode (OLED) with the aging pulse generated from an aging pulse supplier (50 of FIG. 1) while the aging process is in progress as it is coupled to the organic light emitting diode (OLED).

The aging control switching transistor (Ta2) includes a control electrode (or a gate electrode) coupled to the aging gate line (Aging Gate[m]); a first electrode (drain or source) coupled to the aging line (Aging[m]); and a second electrode (source or drain) coupled to an anode of the organic light emitting diode (OLED). The aging control switching transistor (Ta2) can be an N type field effect transistor. However, the kind of the aging control switching transistor (Ta2) is not limited to this embodiment, and it can be replaced with, for example, a P type field effect transistor. While the aging process is in progress, the aging control switching transistor (Ta2) controls the aging pulse supplied to the organic light emitting diode (OLED) as it is turned on or off according to the signal supplied from the aging gate line (Aging Gate[m]).

The aging gate line (Aging Gate[m]) turns on the aging control switching transistor (Ta2) during the aging period as it is coupled to the control electrode (or gate electrode) of the aging control switching transistor (Ta2).

The aging line (Aging[m]) can be formed so as to be fixed to a first power source (ELVDD) in order to prevent voltage hunting or voltage fluctuation by a driving current from happening during the operation of the pixel circuit 215. However, the scope of the present invention is not limited to this embodiment.

The operation of the pixel circuit 215 will be described in greater detail in the following.

Figure 7:
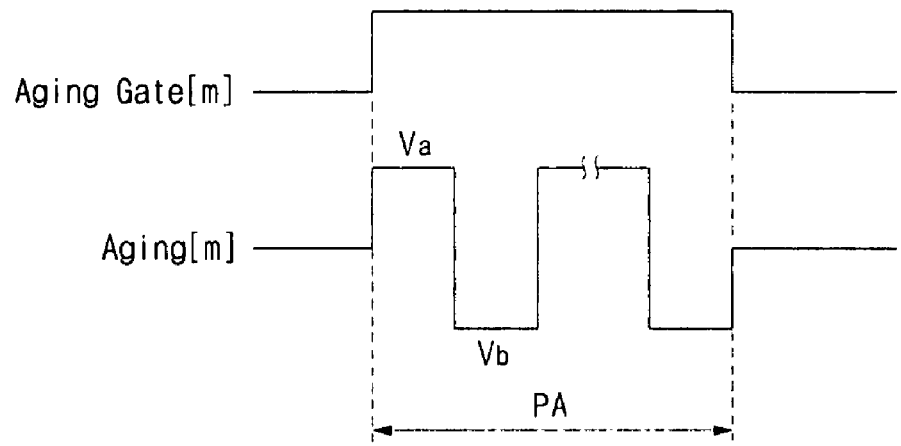
FIG. 7 is a drawing depicting a driving waveform according to an aging method of an organic light emitting diode display according to another embodiment.

FIG. 7 is a drawing depicting a driving waveform according to an aging method using the pixel circuit 215 of the organic light emitting diode display according to another embodiment.

Referring FIG. 7, the pixel circuit 215 of the organic light emitting diode display according to another embodiment is supplied with a voltage of high level (a voltage higher than the threshold voltage level of the aging control switching transistor (Ta2)) through the aging gate line (Aging Gate[m]) during the aging period (PA) and is supplied with an aging pulse of an alternating current through the aging line (Aging[m]). Consequently, as the aging control switching transistor (Ta2) is turned on, a forward and a backward pulse voltage Va and Vb are supplied to the organic light emitting diode (OLED). The aging pulse can be supplied through the aging pulse supplier. The voltage level of the aging pulse is determined to have a voltage level about 25V, the maximum voltage (Va) to −25V, the minimum voltage (Vb). If an excessive voltage is applied, the device can be damaged. However, the voltage level of the aging pulse which is supplied is not limited to this another embodiment, and it can be changed according to the properties of the device, such as thickness of the organic light emitting diode (OLED).

The pixel circuit 215 of the organic light emitting diode display according to another embodiment has an advantageous aspect that another switching transistor (for example, an emission control switching transistor (Te), a third switching transistor (T3)) is not required to be considered because the aging gate line (Aging Gate[m]) is added to the aging circuit 215a. For example, differently from the exemplary embodiment, the aging control switching transistor (Ta2) can use a field effect transistor having the same channel type as that of the emission control switching transistor (Te) because it is not required to use the emission control line (em[n]) during the aging period (PA).

A pixel circuit of an organic light emitting diode display according to another embodiment will be described in the following.

Figure 8:
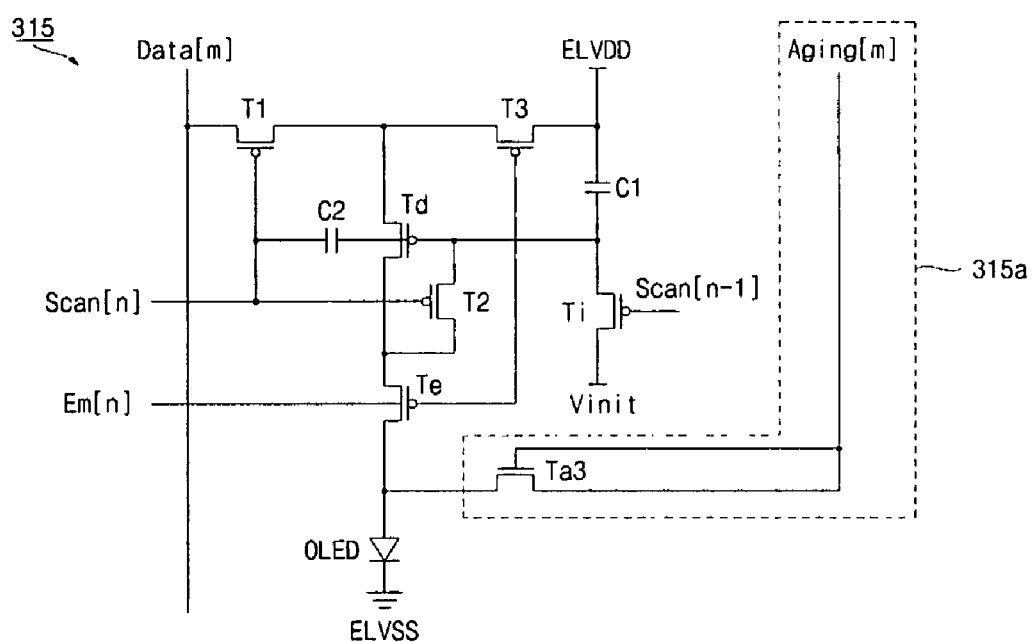
FIG. 8 is a drawing depicting a pixel circuit of an organic light emitting diode display according to another embodiment.

FIG. 8 is a drawing depicting a pixel circuit 315 of an organic light emitting diode display according to another embodiment.

Referring to FIG. 8, a pixel circuit 315 of an organic light emitting diode display according to another embodiment includes an organic light emitting diode (OLED) for displaying an image by a driving current; a driving transistor for supplying the driving current as it is coupled to the organic light emitting diode (OLED); first to second storage capacitors (C1 and C2); first to third switching transistors (T1 to T3); an emission control switching transistor (Te); an initializing switching transistor (Ti); an aging circuit 315a for supplying an aging pulse to the organic light emitting diode (OLED); and a plurality of power sources (ELVDD, ELVSS and Vinit). According to one embodiment, the aging circuit 315a can include an aging line (Aging[m]) coupled to the organic light emitting diode (OLED) and an aging control switching transistor (Ta3) for controlling an aging current which flows through the aging line (Aging[m]). Here, A control electrode (or a gate electrode) of the aging control switching transistor (Ta3) is coupled to the aging line (Aging[m]). The pixel circuit 315 according to this embodiment has a similar structure as that of the pixel circuit 115 of FIG. 2 except for the aging circuit 315a. Therefore, the description will be directed primarily on the parts different from that embodiment.

The aging circuit 315a includes an aging line (Aging[m]) coupled to the organic light emitting diode (OLED) and an aging control switching transistor (Ta3) for controlling an aging current which flows the organic light emitting diode (OLED) as it is coupled to the aging line (Aging[m]).

The aging line (Aging[m]) supplies the organic light emitting diode (OLED) with the aging pulse generated from an aging pulse supplier (50 of FIG. 1) while the aging process is on going as it is coupled to the organic light emitting diode (OLED)

The aging control switching transistor (Ta3) includes a control electrode (or a gate electrode) coupled with the aging line (Aging[m]); a first electrode (drain or source) coupled to the aging line (Aging[m]); and a second electrode (source or drain) coupled with an anode of the organic light emitting diode (OLED). The aging control switching transistor (Ta3) can be an N type field effect transistor. However, the kind of the aging control switching transistor (Ta3) is not limited to this embodiment, and it can be replaced with, for example, a P type field effect transistor. The aging control switching transistor (Ta3) is turned on by the aging pulse supplied from the aging line (Aging[m]) while the aging process is in progress. Consequently, the organic light emitting diode (OLED) is supplied with an aging pulse.

The aging line (Aging[m]) can be formed so that it is fixed to the first power source (ELVDD) in order to prevent voltage hunting or voltage fluctuation by a driving current from happening during the operation of the pixel circuit 215. However, the scope of the present invention is not limited to this embodiment.

An aging method using the pixel circuit 315 described above will be described in greater detail.

Figure 9:
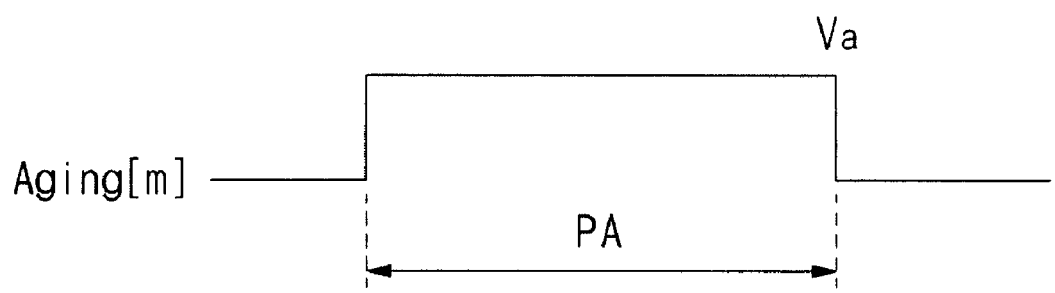
FIG. 9 is a drawing depicting a driving waveform according to an aging method of an organic light emitting diode display according to another embodiment.

FIG. 9 is a drawing depicting a driving waveform according to an aging method of an organic light emitting diode display according to an embodiment.

Referring to FIG. 9, a pixel circuit 315 of an organic light emitting diode display according to this embodiment is supplied with an aging pulse which has an uniform voltage level from the aging line (Aging[m]) during the aging period (PA). An extra line with the purpose to turn on the aging control switching transistor (Ta3) is not required to be added because the control electrode (or gate electrode) and the first electrode (source or drain) of the aging control switching transistor (Ta3) are connected with the aging line (Aging[m]) together.

Merely, according to this embodiment, the aging pulse is determined to have a relatively higher voltage level than the cathode of the organic light emitting diode (OLED) or the second power source (ELVSS). Consequently, an aging current is supplied in one direction selected from a forward current or a backward current between the anode and the cathode of the organic light emitting diode (OLED). Here, the voltage level of the aging pulse is determined so that the maximum voltage level (Va) is about 25V. If the device receives excessive voltage, the organic light emitting diode (OLED) can be damaged. However, the voltage level of the aging pulse is not limited to this embodiment, and it can be changed according to various device parameters, such as the thickness of the organic light emitting diode (OLED). The effect according to a third embodiment of the present invention is the identical as that of the exemplary embodiment and another embodiment of the present invention.

An organic light emitting diode (OLED) included in the organic light emitting diode display describe above will be described in the following.

Figure 10:
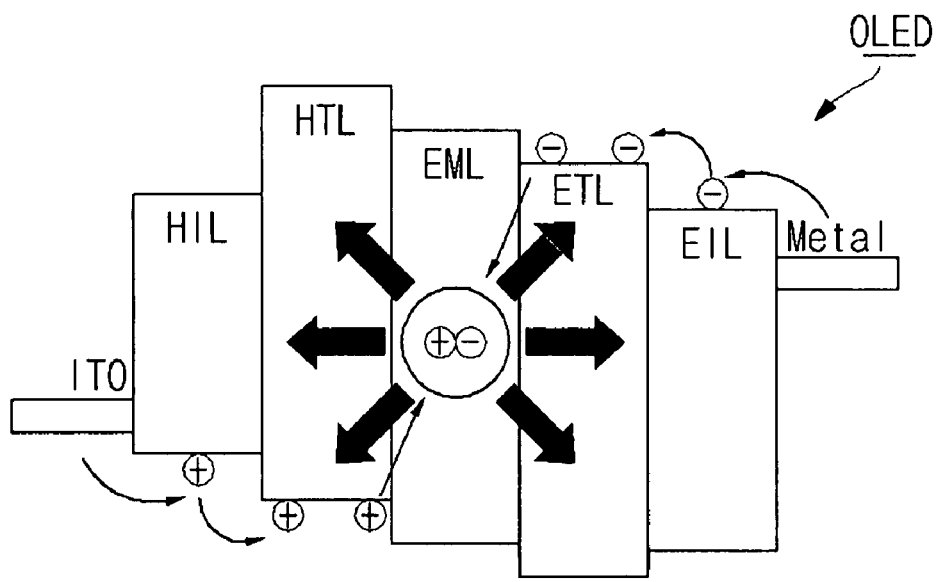
FIG. 10 is a drawing depicting the schematic structure of an organic light emitting diode which may be applied to certain embodiments.

FIG. 10 is a drawing depicting the schematic structure of an organic light emitting diode (OLED).

As illustrated in FIG. 10, the organic light emitting diode (OLED) consists of an anode (ITO), an organic layer and a cathode (Metal). The organic layer can consist of an emitting layer (EML) which emits light when an exciton is formed as an electron and a hole meet; and an electron transport layer (ETL) for transporting an electron; a hole transport layer (HTL) for transporting a hole. In addition, an electron injecting layer (EIL) can be formed on one side of the electron transport layer, and a hole injecting layer (HIL) can also be formed on one side of the hole transport layer. Furthermore, in the case of a phosphorescent organic light emitting diode (OLED), a hole blocking layer (HBL) can be formed selectively between the emitting layer (EML) and the electron transport layer (ETL), and an electron blocking layer (EBL) can be formed selectively between the emitting layer (EML) and the hole transport layer (HTL).

Moreover, the organic layer can be formed in a slim organic light emitting diode (slim OLED) structure in which the thickness of the organic layer can be decreased by mixing two different kinds of layers. For example, a hole injection transport layer (HITL) in which the hole injecting layer and the hole transport layer are formed simultaneously and an electron injection transport layer (EITL) in which the electron injecting layer and the electron transport layer are formed simultaneously can be formed selectively. The object of the slim organic light emitting diode is to improve the emission efficiency.

Furthermore, a buffer layer as a selective layer can be formed between the anode (ITO) and the emitting layer. The buffer layer can be classified into an electron butter layer for buffering an electron and a hole buffer layer for buffering a hole. The electron buffer layer can be formed selectively between the cathode (Metal) and the electron injecting layer (EIL), and it can replace the function of the electron injecting layer. Here, the stack structure of the organic layer can be an emitting layer (EML)/an electron transport layer (ETL)/an electron buffer layer/a cathode (Metal). Furthermore, the hole buffer layer can be formed selectively between the anode (ITO) and the hole injecting layer (HIL), and it can replace the function of the hole injecting layer (HIL). Here, the stack structure of the organic layer can be an anode (ITO)/a hole buffer layer/a hole transport layer (HTL)/an emitting layer (EML).

The following are possible stack structures for the structure mentioned above.

a) Normal Stack Structures 1) an anode/a hole injecting layer/a hole transport layer/an emitting layer/an electron transport layer/an electron injecting layer/a cathode 2) an anode/a hole buffer layer/a hole injecting layer/a hole transport layer/an emitting layer/an electron transport layer/an electron injecting layer/a cathode 3) an anode/a hole injecting layer/a hole transport layer/an emitting layer/an electron transport layer/an electron injecting layer/an electron buffer layer/a cathode 4) an anode/a hole buffer layer/a hole injecting layer/a hole transport layer/an emitting layer/an electron transport layer/an electron injecting layer/an electron buffer layer/a cathode 5) an anode/a hole injecting layer/a hole buffer layer/a hole transport layer/an emitting layer/an electron transport layer/an electron injecting layer/a cathode 6) an anode/a hole injecting layer/a hole transport layer/an emitting layer/an electron transport layer/an electron buffer layer/an electron injecting layer/a cathode b) Normal Slim Structures 1) an anode/a hole injection transport layer/an emitting layer/an electron transport layer/an electron injecting layer/a cathode 2) an anode/a hole buffer layer/a hole injection transport layer/an emitting layer/an electron transport layer/an electron injecting layer/a cathode 3) an anode/a hole injecting layer/a hole transport layer/an emitting layer/an electron injection transport layer/an electron buffer layer/a cathode 4) an anode/a hole buffer layer/a hole transport layer/an emitting layer/an electron buffer layer/a cathode 5) an anode/a hole injection transport layer/a hole buffer layer/an emitting layer/an electron transport layer/an electron injecting layer/a cathode 6) an anode/a hole injecting layer/a hole transport layer/an emitting layer/an electron buffer layer/an electron injection transport layer/a cathode c) Inverted Stack Structures 1) a cathode/an electron injecting layer/an electron transport layer/an emitting layer/a hole transport layer/a hole injecting layer/an anode 2) a cathode/an electron injecting layer/an electron transport layer/an emitting layer/a hole transport layer/a hole injecting layer/a hole buffer layer/an anode 3) a cathode/an electron buffer layer/an electron injecting layer/an electron transport layer/an emitting layer/a hole transport layer/a hole injecting layer/an anode 4) a cathode/an electron buffer layer/an electron injecting layer/an electron transport layer/an emitting layer/a hole transport layer/a hole buffer layer/an anode 5) a cathode/an electron injecting layer/an electron transport layer/an emitting layer/a hole transport layer/a hole buffer layer/a hole injecting layer/an anode 6) a cathode/an electron injecting layer/an electron buffer layer/an electron transport layer/an emitting layer/a hole transport layer/a hole injecting layer/an anode d) Inverted Slim Structures 1) a cathode/an electron injecting layer/an electron transport layer/an emitting layer/a hole injection transport layer/an anode 2) a cathode/an electron injecting layer/an electron transport layer/an emitting layer/a hole injection transport layer/a hole buffer layer/an anode 3) a cathode/an electron buffer layer/an electron injection transport layer/an emitting layer/a hole transport layer/a hole injecting layer/an anode 4) a cathode/an electron buffer layer/an electron injection transport layer/an emitting layer/a hole transport layer/a hole buffer layer/an anode 5) a cathode/an electron buffer layer/an electron transport layer/an emitting layer/a hole buffer layer/a hole injection transport layer/an anode 6) a cathode/an electron injection transport layer/an electron buffer layer/an emitting layer/a hole transport layer/a hole injecting layer/an anode A passive matrix method and an active matrix method are well known driving methods which drive the organic light emitting diode (OLED). The passive matrix method has merits in that the fabricating process is simple and the investment is small because an anode and a cathode meet cross each other in an orthogonal direction, and it is driven as a line is selected, however, it also has a undesirable aspect in that the current consumption can be large when an image is displayed on a large size display. The active matrix method has advantageous features in that the current consumption is small, and the image quality is excellent, and the lifetime is long, and it can be enlarged to a medium large size because an active element and a storage capacitor such as a thin film transistor are formed on each pixel.

In the case of the active matrix method, composing a pixel circuit based on an organic light emitting diode (OLED) and a thin film transistor is beneficial. Here, the crystallization methods of the thin film transistor such as an excimer laser annealing (ELA) using an excimer laser, a metal induced crystallization (MIC) using a metal promoting material and a solid phase crystallization are used. In addition, a SLS (Sequential Lateral Solidification) in which a mask is added to a conventional laser crystallization method can be employed.

In addition, there is micro silicon which has a grain size between amorphous silicon and poly silicon. In general, the micro silicon is silicon whose grain size is between 1 nm to 100 nm. The electron mobility of the micro silicon is from 1 to less than 50, and the hole mobility is from 0.01 to less than 0.2. The grain size of the micro silicon is smaller than the poly silicon, and it has a uniform characteristic because the extrusion region between the grains is formed in a small size so that an electron can move between the grains conveniently. As a whole, a thermal crystallization method and a laser crystallization method are the crystallization method of the micro silicon.

There are a few thermal crystallization methods such as a method in which crystallized structure can be obtained simultaneously with amorphous silicon being deposited and a reheating method.

The laser crystallization method is a method wherein amorphous silicon is crystallized using a laser after it is deposited by a chemical vapor deposition. Here, the kind of the laser used is a diode laser generally. The diode laser uses red wavelengths of 800 nm, and the red wavelengths contribute to a uniform crystallization in which the micro silicon is crystallized uniformly.

The laser crystallization method may be the most widely used crystallization method by which a thin film transistor is crystallized into poly silicon. The laser crystallization method has beneficial aspects in that the crystallization of poly silicon liquid crysTal display device can be used intact, and the fabricating process is simple, and technical development of the processing method is completed.

The metal induced crystallization method is one of the methods in which the crystallization can be accomplished at a low temperature without using the laser crystallization method. Initially, metal promoting materials such as Ni, Co, Pd, and Ti are deposited or spin-coated on the surface of amorphous silicon, then the metal promoting materials infiltrate directly into the surface of the amorphous silicon. Consequently, it has a merit in that the amorphous silicon can be crystallized at a low temperature as the phase of the amorphous silicon is being changed.

The other metal induced crystallization method has a merit in that when a metal layer is interposed on the surface of the amorphous silicon, the intervention of contaminants such as nickel silicide at a specific area of the thin film transistor can be suppressed maximally. The crystallization method mentioned above is also called a metal induced lateral crystallization (MILC). A shadow mask can be used in the metal induced lateral crystallization, and the shadow can be a linear mask or a dot shaped mask.

Another metal induced crystallization method is a metal induced crystallization with capping layer (MICC), wherein when a metal promoting material layer is deposited or spin-coated on the surface of the amorphous silicon, a capping layer is intervened first so that the amount of the metal promoting material flowing into the amorphous silicon can be controlled. A silicon nitride layer can be used as the capping layer. The amount of the metal promoting material flowing from the metal promoting material layer into the amorphous silicon can be changed according to the thickness of the nitride layer. Here, the metal promoting material flowing into the silicon nitride layer can be formed on the entire surface of the silicon nitride layer, and it can be formed selectively using a shadow and so on. The capping layer can be removed selectively after the metal promoting material layer crystallizes the amorphous silicon into poly silicon. A capping layer removing method such as a wet etching method and a dry etching method can be used. Furthermore, after the poly silicon is formed, a gate insulating layer is formed, and a gate electrode is formed on the gate insulating layer. An inter-layer dielectric layer can be formed on the gate electrode. After a via hole is formed on the inter-layer dielectric layer, impurity is injected into the crystallized poly silicon phase through the via hole, and then the contaminants of the metal promoting material formed inside can be removed additionally. The method by which the contaminants of the metal promoting material are removed additionally is called a gattering process. During the gattering process, in addition to a process during which the impurity are injected, a heating process during which a thin film transistor is heated is added. A thin film transistor of fine quality can be accomplished through the gattering process.

As described above, an aging treatment of high luminance having a momentary high voltage level performed by forming an aging circuit at a pixel circuit of an organic light emitting diode display.

Initial decrease of luminance of the organic light emitting diode can be accelerated through an aging method including an aging line of an organic light emitting diode display, accordingly, the lifetime and the white balance of an organic light emitting diode display can be improved.

The reliability of an organic light emitting diode display can be improved because a progressive dark defect is removed through an aging method in which an organic light emitting diode is supplied with a backward aging pulse through a pixel circuit including an aging line.

In addition, the aging efficiency is improved by supplying a forward and a backward alternating current to an organic light emitting diode through an aging line.

The present invention is not limited to the embodiments described above, and various modifications and changes can be made by those skilled in the art without departing from the scope and spirit of the present invention.

What is clamed is:

1. An organic light emitting diode display, comprising:
   an organic light emitting diode configured to emit light;
   a driving transistor coupled to the organic light emitting diode;
   a first storage capacitor comprising a first electrode coupled to a control electrode of the organic light emitting diode and a second electrode coupled to a first power source;
   a first switching transistor comprising a first electrode coupled to a data line, a control electrode coupled to a scan line, and a second electrode coupled to a first electrode of the driving transistor; and
   an aging circuit configured to supply the organic light emitting diode with an aging pulse;
   wherein the aging circuit comprises an aging control switching transistor directly coupled to an anode of the organic light emitting diode and to an aging line.

2. The organic light emitting diode display as claimed in claim 1, wherein the aging control switching transistor comprises a first electrode coupled to the aging line and a second electrode coupled to the anode of the organic light emitting diode.

3. The organic light emitting diode display as claimed in claim 2, wherein the aging control switching transistor comprises a control electrode coupled to an aging gate line.

4. The organic light emitting diode display as claimed in claim 2, wherein the aging control switching transistor comprises a control electrode coupled to the aging line.

5. The organic light emitting diode display as claimed in claim 1, wherein an emission control switching transistor is coupled between the driving transistor and the organic light emitting diode, the emission control switching transistor comprising a control electrode coupled to an emission control line.

6. The organic light emitting diode display as claimed in claim 5, wherein the aging control switching transistor comprises a control electrode coupled to the emission control line.

7. The organic light emitting diode display as claimed in claim 6, wherein the aging control switching transistor has a different channel type as the channel type of the emission control switching transistor.

8. The organic light emitting diode display as claimed in claim 1, wherein the organic light emitting diode comprises a cathode coupled to a second power source.

9. The organic light emitting diode display as claimed in claim 1, wherein the driving transistor comprises a first electrode coupled to the first power source and a second electrode coupled to the anode of the organic light emitting diode.

10. The organic light emitting diode display as claimed in claim 1, further comprising:
    a second switching transistor configured to diode connect the driving transistor including a control electrode coupled to the scan line.

11. The organic light emitting diode display as claimed in claim 5, further comprising:
    a third switching transistor coupled between the first power source and the driving transistor, the third switching transistor comprising a control electrode coupled to the emission control line.

12. The organic light emitting diode display as claimed in claim 1, further comprising:
    a second storage capacitor including a first electrode coupled between the control electrode of the first switching transistor and the scan line and a second electrode coupled to the control electrode of the driving transistor.

13. The organic light emitting diode display as claimed in claim 1, further comprising:

an initializing switching transistor coupled between the first electrode of the first storage capacitor and a third power source, the initializing switching transistor comprising a control electrode coupled to a previous scan line.

14. The organic light emitting diode display as claimed in claim 1, wherein the aging line is coupled to an aging pulse supplier configured to supply the aging pulse.

15. The organic light emitting diode display as claimed in claim 1, wherein the aging line is arranged in parallel direction with the data line.

16. The organic light emitting diode display as claimed in claim 1, wherein the aging pulse comprises an alternating current pulse.

17. The organic light emitting diode display as claimed in claim 16, wherein the aging pulse comprises a voltage level between 25V and −25V.

* * * * *